United States Patent
Hoda et al.

(10) Patent No.: US 10,140,393 B2
(45) Date of Patent: Nov. 27, 2018

(54) SYSTEMS AND METHODS FOR MODELING SUBTERRANEAN FORMATIONS THAT INCLUDE GASEOUS HYDROCARBONS AND ADSORBED HYDROCARBONS

(71) Applicants: Nazish Hoda, Houston, TX (US); Mita Das, Houston, TX (US); Jim H. Lee, Spring, TX (US); Abdel Wadood M. El-Rabaa, Plano, TX (US)

(72) Inventors: Nazish Hoda, Houston, TX (US); Mita Das, Houston, TX (US); Jim H. Lee, Spring, TX (US); Abdel Wadood M. El-Rabaa, Plano, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 753 days.

(21) Appl. No.: 14/428,228

(22) PCT Filed: Sep. 13, 2013

(86) PCT No.: PCT/US2013/059731
§ 371 (c)(1),
(2) Date: Mar. 13, 2015

(87) PCT Pub. No.: WO2014/070315
PCT Pub. Date: May 8, 2014

(65) Prior Publication Data
US 2015/0310140 A1      Oct. 29, 2015

Related U.S. Application Data

(60) Provisional application No. 61/721,276, filed on Nov. 1, 2012.

(51) Int. Cl.
*G06G 7/48*   (2006.01)
*G06F 17/50*  (2006.01)
(Continued)

(52) U.S. Cl.
CPC .......... *G06F 17/5009* (2013.01); *E21B 43/00* (2013.01); *G06F 17/10* (2013.01)

(58) Field of Classification Search
None
See application file for complete search history.

(56) References Cited

U.S. PATENT DOCUMENTS

| 3,079,085 A | 2/1963 | Clark, Jr. et al. |
| 6,412,559 B1 * | 7/2002 | Gunter ................ E21B 41/0064 166/263 |

(Continued)

OTHER PUBLICATIONS

Mengal, Salman Akram, and Robert A. Wattenbarger. "Accounting for adsorbed gas in shale gas reservoirs." SPE middle east oil and gas show and conference. Society of Petroleum Engineers, 2011.*

(Continued)

*Primary Examiner* — Aniss Chad
*Assistant Examiner* — Nithya J. Moll
(74) *Attorney, Agent, or Firm* — ExxonMobil Upstream Research Company—Law Department

(57) ABSTRACT

Systems and methods for modeling subterranean formations that include both gaseous hydrocarbons and adsorbed hydrocarbons. The systems and methods include determining a formation volume factor for gaseous hydrocarbons that may be present within the subterranean formation and correcting the formation volume factor to generate a compensated formation volume factor. The systems and methods further may include simulating a fluid flow within the subterranean formation, with the simulating being based, at least in part, on the compensated formation volume factor. Correcting the formation volume factor may include adjusting the formation volume factor based, at least in part, on a fraction of the adsorbed hydrocarbons within the subterranean formation that desorbs from the subterranean formation and/or transi- (Continued)

tions to gaseous hydrocarbons during production of the gaseous hydrocarbons from the subterranean formation.

48 Claims, 3 Drawing Sheets

(51) Int. Cl.
*E21B 43/00* (2006.01)
*G06F 17/10* (2006.01)

(56) References Cited

U.S. PATENT DOCUMENTS

| | | | |
|---|---|---|---|
| 7,369,979 B1* | 5/2008 | Spivey | E21B 43/14 |
| | | | 702/12 |
| 2009/0216508 A1* | 8/2009 | Dale | E21B 43/00 |
| | | | 703/10 |
| 2010/0250215 A1 | 9/2010 | Kennon et al. | |
| 2012/0318533 A1 | 12/2012 | Keller et al. | |

OTHER PUBLICATIONS

Lewis, Rick, et al. "New evaluation techniques for gas shale reservoirs." Reservoir symposium. 2004.*
Bumb, A.C. et al. (1988), "Gas-Well Testing in the Presence of Desorption for Coalbed Methane and Devonian Shale," *SPE 15227, SPE Formation Evaluation*, pp. 179-185.

* cited by examiner

SYSTEMS AND METHODS FOR MODELING SUBTERRANEAN FORMATIONS THAT INCLUDE GASEOUS HYDROCARBONS AND ADSORBED HYDROCARBONS

CROSS-REFERENCE TO RELATED APPLICATION

This application is the National Stage entry under 35 U.S.C. 371 of PCT/US2013/059731 that published as WO 2014/070315 and was filed on 13 Sep. 2013, which claims the priority benefit of U.S. Provisional Patent Application 61/721,276 filed 1 Nov. 2012 entitled SYSTEMS AND METHODS FOR MODELING SUBTERRANEAN FORMATIONS THAT INCLUDE GASEOUS HYDROCARBONS AND ADSORBED HYDROCARBONS, the entirety of both of which are incorporated by reference herein.

FIELD OF THE DISCLOSURE

The present disclosure is directed generally to systems and methods for modeling subterranean formations that include gaseous hydrocarbons and adsorbed hydrocarbons, and more specifically to systems and methods that utilize a compensated formation volume factor to model the subterranean formations.

BACKGROUND OF THE DISCLOSURE

Certain subterranean formations, such as shale gas reservoirs, coal gas reservoirs, and/or tight gas reservoirs, may include both gaseous hydrocarbons and adsorbed hydrocarbons. The adsorbed hydrocarbons initially may be adhered to and/or adsorbed on a structure, such as a rock matrix, that is present within the subterranean formation. However, upon production of a portion of the gaseous hydrocarbons from the subterranean formation, a portion of the adsorbed hydrocarbons may desorb from the structure, thereby transitioning to gaseous hydrocarbons and increasing an overall amount of gaseous hydrocarbons that may be produced from the subterranean formation. These adsorbed hydrocarbons that desorb from the structure also may be referred to herein as desorbed gaseous hydrocarbons and may form a significant proportion of the overall production of gaseous hydrocarbons from the subterranean formation.

It may be desirable to accurately and/or efficiently predict an overall amount of gaseous hydrocarbons that may be produced from a subterranean formation and/or a rate of gaseous hydrocarbon production under certain reservoir conditions. Thus, it may be desirable to accurately model the effect of adsorbed hydrocarbon desorption on production of the gaseous hydrocarbons.

Historically, models that predict production of gaseous hydrocarbons from traditional gaseous hydrocarbon reservoirs, such as gaseous hydrocarbon reservoirs that do not include a significant quantity of adsorbed hydrocarbons, have ignored the impact of adsorbed hydrocarbon desorption on the production of gaseous hydrocarbons. More recently, models that predict production of gaseous hydrocarbons from subterranean formations that include both gaseous hydrocarbons and adsorbed hydrocarbons have been developed. However, these models either rely on first principles calculations, which make them very computationally intensive, or significantly over-predict the production of gaseous hydrocarbons. Thus, there exists a need for improved systems and methods for modeling subterranean formations that include both gaseous hydrocarbons and adsorbed hydrocarbons.

SUMMARY OF THE DISCLOSURE

Systems and methods for modeling subterranean formations that include both gaseous hydrocarbons and adsorbed hydrocarbons. The systems and methods include determining a formation volume factor for gaseous hydrocarbons that may be present within the subterranean formation and correcting the formation volume factor to generate a compensated formation volume factor. The systems and methods further may include simulating a fluid flow within the subterranean formation, with the simulating being based, at least in part, on the compensated formation volume factor. Correcting the formation volume factor may include adjusting the formation volume factor based, at least in part, on a fraction of the adsorbed hydrocarbons within the subterranean formation that desorbs from the subterranean formation and/or a fraction of the adsorbed hydrocarbons within the subterranean formation that transitions to gaseous hydrocarbons during production of the gaseous hydrocarbons from the subterranean formation.

In some embodiments, the adjusting may include decreasing the formation volume factor. In some embodiments, the decreasing may include decreasing based, at least in part, on a total mass of adsorbed hydrocarbons within the subterranean formation, a total volume of adsorbed hydrocarbons within the subterranean formation, and/or a pressure within the subterranean formation. In some embodiments, the adjusting may, additionally or alternatively, include increasing the formation volume factor. In some embodiments, the increasing may include increasing based, at least in part, on a portion of the total mass and/or volume of adsorbed hydrocarbons within the subterranean formation that does not transition to gaseous hydrocarbons during production of the gaseous hydrocarbons from the subterranean formation and/or a bottom hole pressure within a hydrocarbon well that extends within the subterranean formation.

In some embodiments, the adjusting may include modeling an equilibrium between adsorbed hydrocarbons and gaseous hydrocarbons within the subterranean formation. In some embodiments, the modeling may include modeling with a Langmuir isotherm.

In some embodiments, the systems and methods further may include simulating and/or modeling production of the gaseous hydrocarbons from the subterranean formation. In some embodiments, the systems and methods further may include producing the gaseous hydrocarbons from the subterranean formation. In some embodiments, the systems and methods further may include controlling the producing based, at least in part, on the simulating. In some embodiments, the systems and methods further may include adjusting and/or re-calculating the compensated formation volume factor. In some embodiments, the systems and methods further may include constructing the gaseous hydrocarbon well and/or sizing one or more components of the gaseous hydrocarbon well based, at least in part, on the simulating and/or the modeling.

DETAILED DESCRIPTION AND BEST MODE OF THE DISCLOSURE

Figure 1:
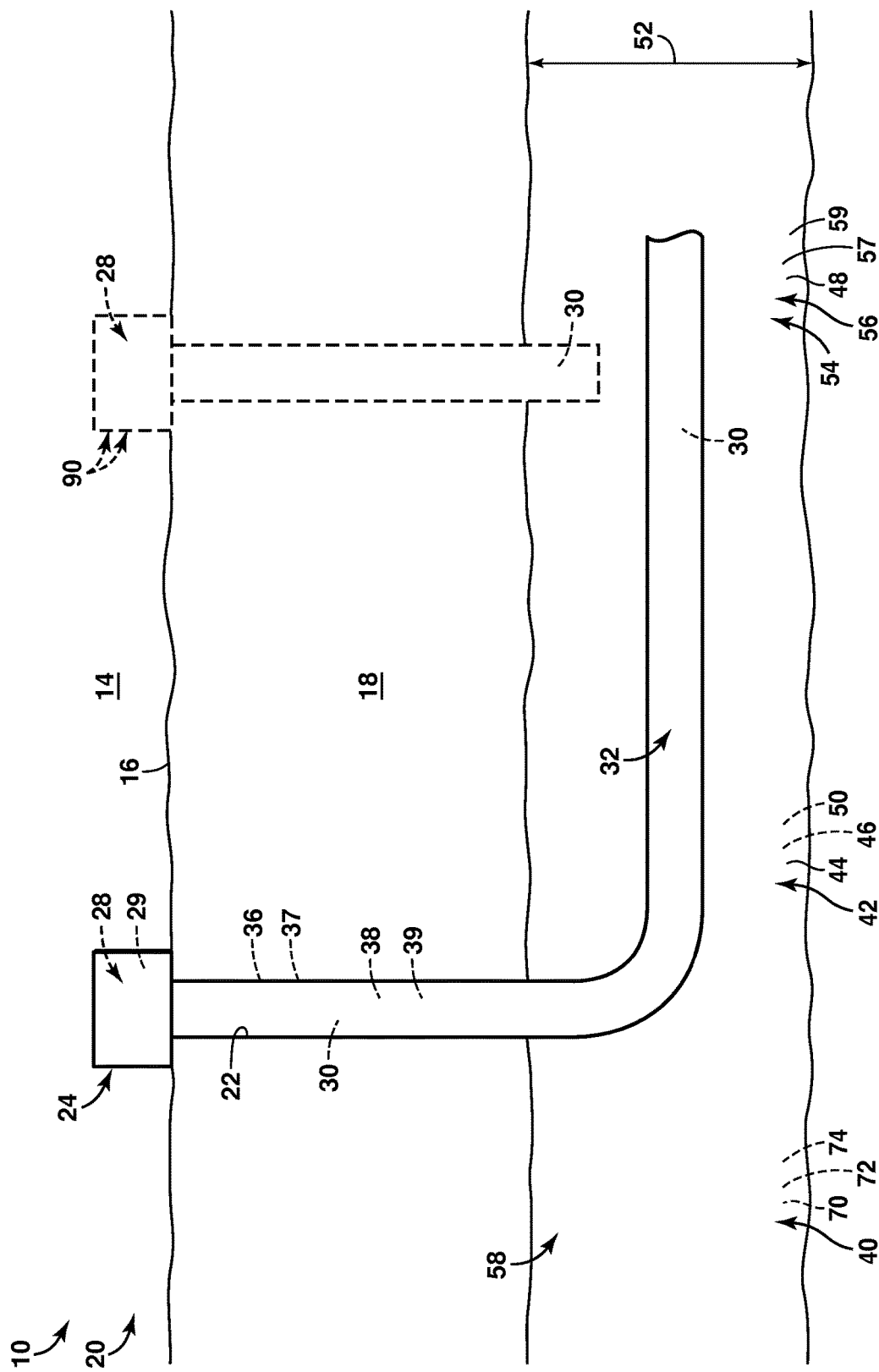
FIG. 1 is a schematic representation of illustrative, non-exclusive examples of a hydrocarbon production assembly that may be utilized with the systems and methods according to the present disclosure.

FIG. 1 is a schematic representation of illustrative, non-exclusive examples of a hydrocarbon production assembly 10 that may be utilized with the systems and methods according to the present disclosure. Hydrocarbon production assembly 10 includes a hydrocarbon well 20 that extends between a surface region 14 and a subterranean formation 40. Subterranean formation 40 may include and/or contain one or more reservoir fluids 42, such as gaseous hydrocarbons 44 and/or water 46 (which may be present as liquid water, gaseous water, and/or adsorbed water), and a wellhead 24 may control a flow of the reservoir fluid as it is produced from well 20. Because at least a significant portion, if not a majority, or optionally even a totality, of the produced hydrocarbons from hydrocarbon well 20 will be gaseous hydrocarbons, it is within the present disclosure that hydrocarbon production assembly 10, hydrocarbon well 20, and reservoir fluid 42 additionally or alternatively may be referred to herein as gaseous hydrocarbon production assembly 10, gaseous hydrocarbon well 20, and gaseous reservoir fluid 42, respectively.

As discussed in more detail herein, a control system 28 may monitor, model, and/or control the operation of at least a portion of the hydrocarbon production assembly. As also discussed in more detail herein, one or more observation wells 90, which may be separate from hydrocarbon well 20 and extend between surface region 14 and subterranean formation 40, may be associated with, utilized with, and/or form a portion of hydrocarbon production assembly 10 and/or control system 28. As an illustrative, non-exclusive example, control system 28 may utilize observation wells 90, when present, to monitor one or more properties of subterranean formation 40.

Hydrocarbon well 20 may include any suitable structure that is configured to extend between surface region 14 and subterranean formation 40 and to convey reservoir fluid 42 therebetween. As an illustrative, non-exclusive example, the hydrocarbon well may include a wellbore 22 that contains and/or defines a fluid conduit 32 therein. Fluid conduit 32 may be defined by, defined primarily by, or defined entirely by wellbore 22. However, and as illustrated in dashed lines in FIG. 1, hydrocarbon well 20 further may include a casing 36 and/or a liner 37 that may extend within wellbore 22 and define fluid conduit 32. Hydrocarbon well 20 further may include additional structures, illustrative, non-exclusive examples of which include pumps 38 and/or valves 39, which may control the flow of reservoir fluid 42 therein.

Subterranean formation 40 may include, contain, and/or be any suitable structure that includes and/or contains reservoir fluid 42 and hydrocarbons 48 that are adsorbed within the formation. As illustrative, non-exclusive examples, subterranean formation 40 may include and/or be a shale gas formation 70, a tight gas formation 72, and/or a coal gas formation 74. The subterranean formation further may include, contain, and/or be a structure 54, such as a rock matrix 56, that may include hydrocarbons 48 adsorbed thereon. Such hydrocarbons may be referred to herein as adsorbed hydrocarbons 48, at least while adsorbed on rock matrix 56 and/or other structure 54.

Reservoir fluid 42 may be present within subterranean formation 40 at a reservoir pressure, which also may be referred to as reservoir pressure (P), the pressure within the subterranean formation, and/or pressure (P) within the subterranean formation. As discussed in more detail herein, adsorbed hydrocarbons 48 may exist within subterranean formation 40 in equilibrium with gaseous hydrocarbons 44; and the adsorbed hydrocarbons may desorb from the subterranean formation to form desorbed hydrocarbons 50, which may be, may be equivalent to, and/or may be referred to herein as gaseous hydrocarbons 44. Additionally or alternatively, gaseous hydrocarbons 44 may adsorb to the subterranean formation, thereby becoming adsorbed hydrocarbons 48. The pressure within the subterranean formation may establish, define, and/or otherwise control an equilibrium concentration of gaseous hydrocarbons 44 and adsorbed hydrocarbons 48 (or ratio of gaseous hydrocarbons 44 to adsorbed hydrocarbons 48) within subterranean formation 40 for a given temperature within the subterranean formation.

As used herein, the term "given" may refer to a value of a parameter at a chosen, specific, and/or selected time and location (i.e., a value of the parameter that might be obtained by performing a measurement at the selected time and location, though it is within the scope of the present disclosure that the value of the parameter need not, necessarily, be measured). As an illustrative, non-exclusive example, the phrase "given temperature within the subterranean formation" may refer to a temperature within the subterranean formation that might be measured at a specific time and at a specific, selected, desired, and/or target location within the subterranean formation.

As discussed in more detail herein, the pressure within the subterranean formation may be greater than a pressure within surface region 14. As such, a volume that may be occupied by gaseous hydrocarbons 44 while the gaseous hydrocarbons are located within subterranean formation 40 may be less than a volume that the gaseous hydrocarbons would occupy when located within surface region 14 and/or when at a standard temperature and standard pressure (STP), such as a pressure of 101.3 kilopascals and a temperature of 0° C. This difference in volume may be quantified as a formation volume factor ($B_g$), which is defined as the volume that the gaseous hydrocarbons occupy at the temperature and the pressure of subterranean formation 40 divided by the volume of the gaseous hydrocarbons at STP, which may be, but is not required to be, approximated by the ideal gas law (i.e., gas volume in liters equals 22.4 times the number of moles of gas that are present).

Subterranean formation 40 may define, include, and/or otherwise have a pay thickness 52, which also may be referred to herein as a net pay thickness 52 and/or an average pay thickness 52, and a drainage area 58, which also may be referred to herein as an average drainage area 58. The net pay thickness and average drainage area together may define a volume, an approximate volume, and/or an effective volume of the subterranean formation, such as by a mathematical product thereof. As used herein, net pay thickness 52 may refer to a net, average, effective, mean, median, and/or mode thickness of subterranean formation 40 across drainage area 58 thereof, may be measured in units of length, such as meters, and also may be referred to herein as net pay thickness (h).

As used herein, drainage area 58 may refer to an area, or region, of subterranean formation 40 that is measured in a plane that is perpendicular to a direction that defines net pay thickness 52, a plane that is parallel to an interface 16 between surface region 14 and a subsurface region 18 that includes subterranean formation 40, and/or a plane that defines an area of maximum extent of the subterranean formation. Drainage area 58 also may be referred to herein as drainage area (A), and drainage area 58 may be measured in units of length squared, such as square meters.

Rock matrix 56 may include and/or define pores 59, which also may be referred to herein as void space 59, that may contain gaseous hydrocarbons 44 and/or water 46 (in liquid and/or gaseous form) therein. A ratio of a total volume of liquid water 46 within pores 59 to a total volume of pores 59 may define a water saturation of pores 59, which also may be referred to herein as water saturation ($S_w$). Adsorbed hydrocarbons 48 and/or adsorbed water 46 may be adsorbed on a surface 57 of rock matrix 56 that defines pores 59.

Rock matrix 56 further may define a rock matrix density and/or a rock matrix porosity. The rock matrix density also may be referred to herein as rock matrix density ($\rho_r$) and/or a density ($\rho_r$) of rock within subterranean formation 40 and may be measured in units of mass per unit volume, such as kilograms per cubic meter. The rock matrix porosity also may be referred to herein as rock matrix porosity ($\varphi$), porosity ($\varphi$) of rock matrix 56, and/or porosity ($\varphi$) of subterranean formation 40, and the rock matrix porosity may be defined as a ratio of a total volume of pores 59 to the volume of subterranean formation 40.

Control system 28 may include any suitable structure that is adapted, configured, and/or programmed to monitor, model, and/or control the operation of gaseous hydrocarbon production assembly 10 and/or any suitable component thereof. As an illustrative, non-exclusive example, control system 28 may include and/or be in communication with a storage medium 29, which also may be referred to herein as a computer-readable storage medium 29, a storage media 29, a non-transitory storage media 29, and/or a non-transitory computer-readable storage media 29, that may include a plurality of executable instructions that may instruct control system 28 to perform any suitable action, including the illustrative, non-exclusive examples of methods that are disclosed herein.

As another illustrative, non-exclusive example, control system 28 may include and/or be in communication with (such as to receive data and/or other inputs therefrom) one or more detectors 30 that may be configured to detect a property of hydrocarbon well 20 and/or subterranean formation 40. As illustrative, non-exclusive examples, detectors 30 may be configured to detect a temperature within well 20, the temperature within subterranean formation 40 (which may be substantially similar to the temperature within well 20), a composition of reservoir fluid 42, and/or a flow rate of reservoir fluid 42 within fluid conduit 32.

As additional illustrative, non-exclusive examples, detectors 30 may detect any suitable pressure, such as a bottom hole pressure within hydrocarbon well 20 and/or the pressure within subterranean formation 40. The bottom hole pressure within hydrocarbon well 20 may include any suitable pressure that may be detected at any suitable location within hydrocarbon well 20, such as within a portion of the hydrocarbon well that extends within subterranean formation 40, and also may be referred to herein as bottom hole pressure ($p_{BHP}$).

Detectors 30 may be associated with, or even associated entirely with, hydrocarbon well 20. However, one or more detectors 30 also optionally may be associated with an observation well 90. As an illustrative, non-exclusive example, a first detector 30 may be located within hydrocarbon well 20 and may detect the bottom hole pressure therein, while a second detector 30 may be located within observation well 90 and may detect the pressure within subterranean formation 40. When reservoir fluid 42 is flowing within hydrocarbon well 20 such as when being produced therefrom, the bottom hole pressure may be different from the pressure within subterranean formation 40. Under these conditions, detection of the bottom hole pressure within the hydrocarbon well and detection of the pressure within the subterranean formation via the observation well may permit independent and/or more accurate determination of the two pressures.

Control system 28 may be adapted, configured, and/or programmed to perform any of the methods that are disclosed herein. As an illustrative, non-exclusive example, the control system may be programmed to model and/or predict a flow of reservoir fluid 42 within subterranean formation 40, a production of gaseous hydrocarbons 44 from subterranean formation 40, and/or a production of gaseous hydrocarbons 44 by hydrocarbon well 20. As another illustrative, non-exclusive example, control system 28 may be programmed to control the production of reservoir fluid 42 and/or gaseous hydrocarbons 44 from subterranean formation 40, such as based upon the model. As yet another illustrative, non-exclusive example, control system 28 may be programmed to regulate, adjust, and/or otherwise control the operation of hydrocarbon well 20, such as based upon the model. As another illustrative, non-exclusive example, control system 28 may predict a depletion pressure for the subterranean formation and restrict and/or cease production from the subterranean formation responsive to determining that the pressure within the subterranean formation is less than or equal to the depletion pressure.

The controlling may include controlling a production rate of reservoir fluid 42 and/or gaseous hydrocarbons 44 from hydrocarbon well 20 and/or transitioning hydrocarbon well 20 between and/or among any suitable number of operational states, including at least a producing state, in which the hydrocarbon well is producing the reservoir fluid, and an idle state, in which the hydrocarbon well is not producing the reservoir fluid. The controlling additionally or alternatively may include controlling any suitable pressure, such as the bottom hole pressure, using any suitable valve 39 and/or pump 38.

As schematically illustrated in FIG. 1, control system 28 may form a portion of gaseous hydrocarbon production assembly 10. However, it is within the scope of the present disclosure that control system 28 may be separate, independent, and/or distinct from gaseous hydrocarbon production assembly 10 and/or may be utilized separately from, independently from, distinctly from, and/or without gaseous hydrocarbon production assembly 10. As an illustrative, non-exclusive example, the control system may model and/or predict the flow of reservoir fluid 42 within subterranean formation 40, the production of gaseous hydrocarbons 44 from subterranean formation 40, and/or the production of gaseous hydrocarbons 44 by hydrocarbon well 20 independently from and/or without interacting with gaseous hydrocarbon production assembly 10 and/or any component thereof, such as hydrocarbon well 20 and/or observation well 90. As another illustrative, non-exclusive example, this modeling (and thus control system 28) may be utilized prior to and/or during construction of hydrocarbon well 20 and/or observation well 90 to select and/or size one or more components of the respective wells, such as casing 36, liner 37, pump 38, and/or valve 39 (as illustrated in FIG. 1 with reference to hydrocarbon well 20), and/or equipment associated with the well, such as storage vessels and transport equipment. As a further illustrative, non-exclusive example, this modeling (and thus control system 28) may be utilized to schedule, coordinate, and/or determine production timing and/or duration, personnel, equipment, and/or associated (including expected subsequent) production and/or other well-related operations. When control system 28 is utilized separately from gaseous hydrocarbon assembly 10, control system 28 also may be referred to herein as a modeling system 28, a computer 28, and/or a computer system 28.

As discussed, adsorbed hydrocarbons 48 may desorb from subterranean formation 40, thereby transitioning from adsorbed hydrocarbons 48 to desorbed hydrocarbons 50, which also may be referred to herein as and/or may be equivalent to gaseous hydrocarbons 44. During production of the gaseous hydrocarbons from the subterranean formation, the pressure within the subterranean formation may decrease, thereby providing a driving force for this desorption. In certain subterranean formations, desorbed hydrocarbons 50 may comprise a significant fraction and/or a majority of the gaseous hydrocarbons that are produced from the subterranean formation during a service life of hydrocarbon well 20. As such, quantifying, predicting, and/or modeling an amount of adsorbed hydrocarbons 48 that may transition to desorbed hydrocarbons 50 may provide a better understanding and/or control of production of gaseous hydrocarbons 44 from the subterranean formation.

Desorption of an adsorbed gas from a surface, such as desorption of adsorbed hydrocarbons 48 from surface 57 of rock matrix 56 or other structure 54, may be modeled and/or predicted in a variety of ways. As an illustrative, non-exclusive example, a Langmuir isotherm may predict a volume of adsorbed hydrocarbons 48 that may be present within a unit mass of subterranean formation 40 under equilibrium conditions for a given temperature and pressure.

Figure 2:
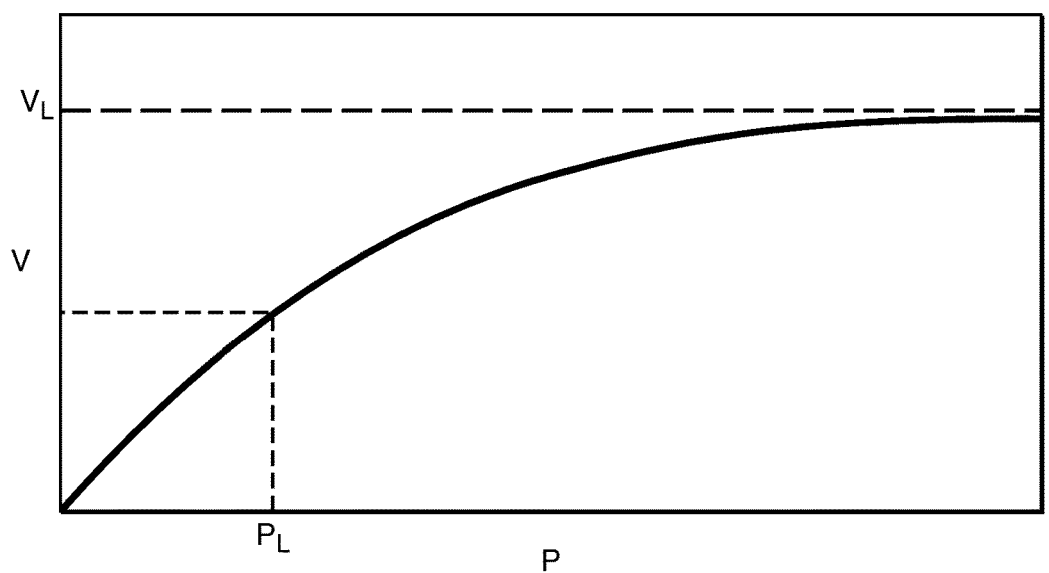
FIG. 2 is a schematic representation of an illustrative, non-exclusive example of a Langmuir isotherm that may be utilized with the systems and methods according to the present disclosure.

A schematic representation of an illustrative, non-exclusive example of a Langmuir isotherm is shown FIG. 2 and discussed herein with reference to subterranean formation 40 of FIG. 1. FIG. 2 plots the amount of adsorbed hydrocarbons (V) (in units of volume adsorbed hydrocarbon 48 per unit mass of rock matrix 56, such as cubic meters per kilogram) as a function of pressure (P) of subterranean formation 40 for a given temperature. The governing equation for the Langmuir isotherm may be represented as shown in Equation (1):

$$V = \frac{V_L P}{P + P_L} \quad (1)$$

where V is defined above, $V_L$ is the Langmuir volume, which, as discussed, is an experimentally determined parameter for a given adsorbed hydrocarbon-rock matrix system and has the same units as V, P is the pressure (in units of pressure, such as Pascals), and $P_L$ is the Langmuir pressure, which is another experimentally determined parameter for the given adsorbed hydrocarbon-rock matrix system and has the same units as P.

For the given adsorbed hydrocarbon-rock matrix system at a given temperature, $V_L$ represents a maximum volume of adsorbed hydrocarbon that may be adsorbed onto the rock matrix and may be determined experimentally by estimating the value of V at infinite P, as illustrated in FIG. 2. In addition, and for the given adsorbed hydrocarbon-rock matrix system at the given temperature, $P_L$ represents a pressure at which V is equal to $V_L/2$, which is also illustrated in FIG. 2. Thus, $V_L$ and $P_L$ may be determined experimentally by measuring V as a function of P for the given adsorbed hydrocarbon-rock matrix system at the given temperature (such as by compressing the gaseous hydrocarbons in the presence of a sample, or portion, of the rock matrix at the given temperature and measuring the pressure that is associated with a given compression, or volume), estimating the value of V at infinite P from the resultant data (which provides an estimate of $V_L$), and determining the value of P at $V=V_L/2$ (which provides an estimate of $P_L$).

Once a functional relationship for the amount (or volume) of adsorbed hydrocarbons as a function of pressure for the given adsorbed hydrocarbon-rock matrix system (such as the above-discussed Langmuir isotherm) has been established, estimated, and/or assumed, this relationship may be utilized to model adsorption and/or desorption of hydrocarbons from the rock matrix, and thus to model the equilibrium relationship between adsorbed hydrocarbons 48 and gaseous hydrocarbons 46 (or desorbed hydrocarbons 50) for a given temperature and pressure within subterranean formation 40 and/or rock matrix 56 thereof.

As discussed, it may be desirable to model, predict, and/or otherwise estimate a total volume of gaseous hydrocarbons 44 that may be produced from a subterranean formation that includes both gaseous hydrocarbons 44 and adsorbed hydrocarbons 48. As also discussed, desorbed hydrocarbons 50, which may be produced by desorption of adsorbed hydrocarbons 48, may comprise a significant fraction of the overall gaseous hydrocarbons that may be produced from the subterranean formation.

The present disclosure accounts for this contribution of adsorbed hydrocarbons to the production of gaseous hydrocarbons through modification of formation volume factor $B_g$ to produce a compensated formation volume factor, $B_g^c$. The compensated formation volume factor may be modified to account for gaseous hydrocarbons that may be present within the subterranean formation as a first source $S_1$ of gaseous hydrocarbons and to account for adsorbed hydrocarbons that may be present within the subterranean formation as a second source $S_2$ of gaseous hydrocarbons. The compensated formation volume factor may be calculated based on a sum of the first source and the second source, such as by summing the first source and the second source in parallel, as illustrated in Equation (2):

$$B_g^c = \frac{1}{\frac{1}{s_1} + \frac{1}{s_2}} \quad (2)$$

First source $S_1$ may be estimated from the formation volume factor $B_g$, an illustrative, non-exclusive example of which is discussed in more detail herein with reference to FIG. 1. Second source $S_2$ may be estimated in any suitable manner that may account for a fraction of the adsorbed hydrocarbons that may desorb from the rock matrix (or transition from adsorbed hydrocarbons to desorbed/gaseous hydrocarbons) during production of gaseous hydrocarbons from the subterranean formation.

As an illustrative, non-exclusive example, the systems and methods disclosed herein may adjust, or decrease, formation volume factor $B_g$, thereby producing compensated formation volume factor $B_g^c$, based upon a total volume, TV, of the adsorbed hydrocarbons that is present in the subterranean formation. The total volume of the adsorbed hydrocarbons may be estimated and/or calculated using Equation (3):

$$TV = \rho_r Ah(1-\varphi)V_L\left(\frac{P}{P+P_L}\right) \quad (3)$$

where $\rho_r$ is the density of the rock matrix, A is the drainage area, h is the net pay thickness, $\varphi$ is the porosity of the rock matrix, $V_L$ is the Langmuir volume, and $P_L$ is the Langmuir pressure. Illustrative, non-exclusive examples of $\rho_r$, A, H, and $\varphi$ are discussed in more detail herein with reference to FIG. 1. Illustrative, non-exclusive examples of $V_L$ and $P_L$ are discussed in more detail herein with reference to FIG. 2.

As another illustrative, non-exclusive example, the systems and methods disclosed herein may adjust, or increase, formation volume factor $B_g$, thereby producing compensated formation volume factor $B_g^c$, based upon a portion of the total volume of the adsorbed hydrocarbons that does not transition to gaseous hydrocarbons during production of the gaseous hydrocarbons from the subterranean formation, $TV_{NT}$. The total volume that does not transition may be estimated and/or calculated using Equation (4):

$$TV_{NT} = \rho_r Ah(1-\varphi)V_L\left(\frac{p_{BHP}}{p_{BHP}+P_L}\right) \quad (4)$$

where $p_{BHP}$ is the bottom hole pressure. Illustrative, non-exclusive examples of $p_{BHP}$ are discussed in more detail herein with reference to FIG. 1.

As yet another illustrative, non-exclusive example, the systems and methods disclosed herein may adjust the formation volume factor $B_g$, thereby producing compensated formation volume factor $B_g^c$, based upon a ratio of a free gas in place, GIP, to a recoverable adsorbed gas in place, $GIP^{ra}$. Thus, Equation (2) also may be written as Equation (5):

$$B_g^c = \frac{1}{\frac{1}{B_g}+\frac{GIP^{ra}}{GIP}} \quad (5)$$

The recoverable adsorbed gas in place may be determined using Equation (6).

$$GIP^{ra} = TV - TV_{NT} = \rho_r Ah(1-\varphi)V_L\left(\frac{P}{P+P_L}-\frac{p_{BHP}}{p_{BHP}+P_L}\right) \quad (6)$$

Calculation of the free gas in place may vary depending upon the conditions within the subterranean formation. As an illustrative, non-exclusive example, and when no, or very little, liquid water is present within the subterranean formation, GIP may be described by Equation (7):

$$GIP = \frac{Ah\varphi}{B_g} \quad (7)$$

Alternatively, and when liquid water, or a significant amount of liquid water, is present within the subterranean formation, or within the pores thereof, GIP may be described by Equation (8):

$$GIP = \frac{Ah\varphi(1-S_w)}{B_g} \quad (8)$$

where $S_w$ is the water saturation within the pores of the subterranean formation and is discussed in more detail herein with reference to FIG. 1.

Formation volume factor $B_g$ is a well-known parameter that is utilized in a variety of commercially available and/or proprietary simulators that simulate fluid flow within and/or hydrocarbon production from a subterranean formation. Generally, $B_g$ is less than 1.0 for gaseous hydrocarbons (since the gaseous hydrocarbons are compressed at reservoir pressure to a volume that is smaller than their volume at STP) and greater than 1.0 for liquid hydrocarbons (since the liquid hydrocarbons typically include dissolved gasses under reservoir conditions and decrease in volume as the pressure is lowered to STP due to evolution of the dissolved gasses from the liquid hydrocarbons). However, and in these simulators, the formation volume factor is utilized to account for changes in volume that may occur when liquid and/or gaseous hydrocarbons are removed from the subterranean formation, and not to account for phase changes (such as desorption of adsorbed hydrocarbons) within the subterranean formation that may contribute to an overall amount of gaseous hydrocarbons that may be produced from the subterranean formation.

As discussed herein, the systems and methods according to the present disclosure include modification and/or adjustment of formation volume factor $B_g$ to produce compensated formation volume factor $B_g^c$. The compensated formation volume factor includes two distinct hydrocarbon sources, $S_1$ and $S_2$, which may each contribute to the overall amount of gaseous hydrocarbons that may be produced from the subterranean formation.

In addition, and as discussed, second source $S_2$, which accounts for adsorbed hydrocarbons that may be present within the subterranean formation, is not based solely on the total volume, or amount, of adsorbed hydrocarbons that may be present within the subterranean formation (such as TV) but instead on the total volume, or amount, of the adsorbed hydrocarbons that may transition to desorbed hydrocarbons during production of the gaseous hydrocarbons from the subterranean formation (such as a difference between TV and $TV_{NT}$), as discussed herein. Thus, and as used herein, the compensated formation volume factor decreases a potential for over-estimating the amount of gaseous hydrocarbons that may be produced from the subterranean formation by limiting the estimated desorption of adsorbed hydrocarbons from the subterranean formation (such as via Equation (4)).

By using compensated formation volume factor $B_g^c$ in place of the more traditional formation volume factor $B_g$ in the simulators, production of gaseous hydrocarbons from subterranean formations that include both gaseous hydrocarbons and adsorbed hydrocarbons may be more accurately modeled without the need for, or requiring, the simulators to model and/or consider the phase changes that take place when the adsorbed hydrocarbons transition to gaseous hydrocarbons. This may decrease a complexity, decrease a cost, and/or increase a speed of the simulation process, and it is within the scope of the present disclosure that the compensated formation volume factor may be utilized with, or in, any suitable simulator. Illustrative, non-exclusive examples of these simulators include analytical simulators, numerical simulators, commercially available simulators, and/or proprietary simulators.

Equations (1)-(8) are disclosed herein with reference to modeling production of gaseous hydrocarbons from a subterranean formation and/or modeling adsorbed hydrocarbon desorption from the subterranean formation. However, it is within the scope of the present disclosure that the systems and methods disclosed herein may be utilized to model any suitable chemical, compound, and/or material that may exist in both an adsorbed state and a gaseous state within the subterranean formation. Illustrative, non-exclusive examples of these chemicals, compounds, and/or materials include water, specific and/or individual hydrocarbons, such as any suitable specific and/or individual hydrocarbon with 1, 2, 3, 4, 5, 6, 7, 8, 9, 10, or more than 10 carbon atoms, alkanes, alkenes, alkynes, cyclic hydrocarbons, and/or conjugated hydrocarbons.

As an illustrative, non-exclusive example, and when the systems and methods disclosed herein are utilized to model the production of water vapor from the subterranean formation, the procedure that is described herein with reference to FIG. 2 and Equation (1) may be utilized to determine the Langmuir volume and the Langmuir pressure for water desorption from the rock matrix. Subsequently, Equations (2)-(8) may be applied directly to the water production by inserting the determined Langmuir volume and Langmuir pressure of water therein, with $B_g$ being calculated and/or determined based upon the formation volume factor of water vapor within the subterranean formation.

Figure 3:
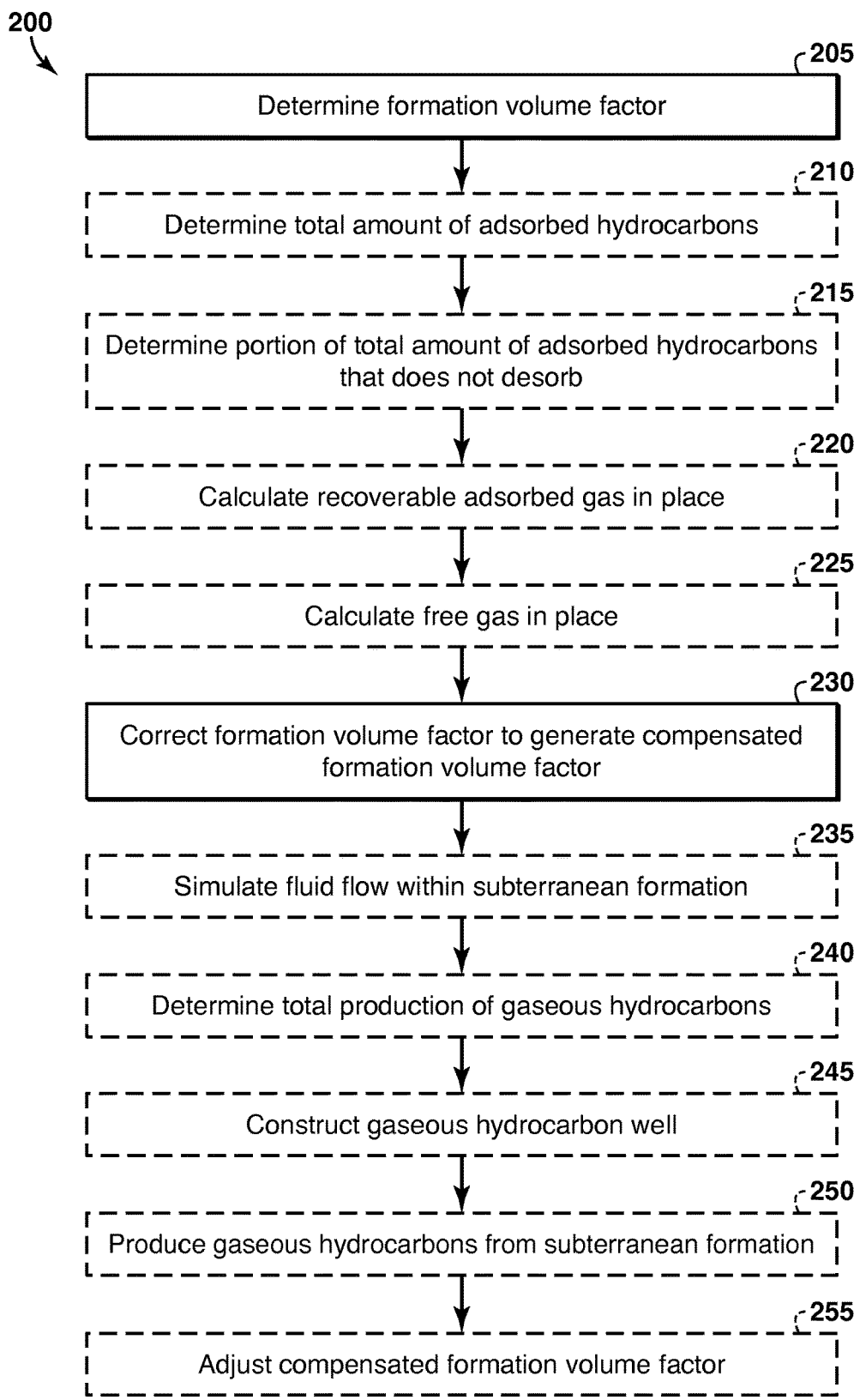
FIG. 3 is a flowchart depicting methods according to the present disclosure of calculating a compensated formation volume factor, simulating a fluid flow within a subterranean formation, producing gaseous hydrocarbons from the subterranean formation, constructing a gaseous hydrocarbon well, and/or determining a total volume of gaseous hydrocarbons that may be produced from the subterranean formation.

FIG. 3 is a flowchart depicting methods 200 according to the present disclosure of calculating a compensated formation volume factor, simulating a fluid flow within a subterranean formation, producing gaseous hydrocarbons from the subterranean formation, constructing a gaseous hydrocarbon well, and/or determining a total volume of gaseous hydrocarbons that may be produced from the subterranean formation. Methods 200 include determining a formation volume factor at 205 and optionally may include determining a total amount of adsorbed hydrocarbons within the subterranean formation at 210, determining a portion of the total amount of adsorbed hydrocarbons that does not desorb from the subterranean formation at 215, calculating a recoverable adsorbed gas in place within the subterranean formation at 220, and/or calculating a free gas in place within the subterranean formation at 225. Methods 200 further include correcting the formation volume factor to generate a compensated formation volume factor at 230 and optionally may include simulating a fluid flow within the subterranean formation at 235, determining a total production of gaseous hydrocarbons from the subterranean formation at 240, constructing a gaseous hydrocarbon well that extends within the subterranean formation at 245, producing the gaseous hydrocarbons from the subterranean formation at 250, and/or adjusting the compensated formation volume factor at 255.

Determining the formation volume factor at 205 may include the use of any suitable system and/or method to determine the formation volume factor for the gaseous hydrocarbons that are present within the subterranean formation. As discussed in more detail herein, the formation volume factor may provide a measure, or ratio, of the volume that is occupied by the gaseous hydrocarbons when the gaseous hydrocarbons are present within the subterranean formation when compared to a volume of the gaseous hydrocarbons at STP.

The formation volume factor may be determined in any suitable manner. As an illustrative, non-exclusive example, the formation volume factor may be previously determined, tabulated, and/or otherwise supplied. Thus, the determining may include receiving and/or utilizing the previously determined formation volume factor. As another illustrative, non-exclusive example, the formation volume factor may be calculated in any suitable manner. As an illustrative, non-exclusive example, the calculating may include simulating at least a portion of the subterranean formation with a numerical and/or an analytical simulator.

As another illustrative, non-exclusive example, the calculating may include measuring the formation volume factor. The measuring may include producing a produced gas from the subterranean formation, compressing the produced gas, measuring a volume of the produced gas at a pressure and a temperature of the subterranean formation, and/or producing a pressure vs. volume curve for the produced gas at a given temperature.

Determining the total amount of adsorbed hydrocarbons within the subterranean formation at 210 may include the use of any suitable system, method, and/or algorithm to determine an amount, mass, and/or volume of adsorbed hydrocarbons that may be present within the subterranean formation and/or adsorbed on the rock matrix thereof. It is within the scope of the present disclosure that the determining at 210 may include determining the total amount of adsorbed hydrocarbons experimentally and/or mathematically. As an illustrative, non-exclusive example, the determining at 210 may include experimentally determining the total amount of adsorbed hydrocarbons, such as by measuring the pressure within the subterranean formation and/or the Langmuir pressure and Langmuir volume of the adsorbed hydrocarbon-rock matrix system, as discussed in more detail herein. As another illustrative, non-exclusive example, the determining at 210 may include determining the total volume of adsorbed hydrocarbons using Equation (3).

Determining the portion of the total amount of adsorbed hydrocarbons that does not desorb from the subterranean formation at 215 may include the use of any suitable system, method, and/or algorithm to determine an amount, mass, and/or volume of adsorbed hydrocarbons that may be present within the subterranean formation and/or adsorbed on the rock matrix thereof and that may not desorb from the subterranean formation and/or that may not desorb under the pressure and/or temperature of the subterranean formation.

Similar to the determining at 210, the determining at 215 may include experimentally and/or mathematically determining the portion of the total amount of adsorbed hydrocarbons that does not desorb from the subterranean formation. As illustrative, non-exclusive examples, this may include measuring the pressure within the subterranean formation, measuring the Langmuir pressure and the Langmuir volume of the adsorbed hydrocarbon-rock matrix system, and/or measuring, determining, and/or estimating a bottom hole pressure in a hydrocarbon well that extends within the subterranean formation (or a lowest expected bottom hole pressure that may be achieved during production of the gaseous hydrocarbons from the subterranean formation). As another illustrative, non-exclusive example, the determining at 215 may include determining the total volume of adsorbed hydrocarbons that does not desorb from the subterranean formation (or transition to desorbed hydrocarbons) during production of the gaseous hydrocarbons from the subterranean formation using Equation (4).

Calculating the recoverable adsorbed gas in place within the subterranean formation at 220 may include the use of any suitable system, method, and/or algorithm to determine, estimate, and/or calculate an amount, mass, and/or volume of adsorbed hydrocarbons that may be present within the subterranean formation and/or adsorbed on the rock matrix thereof, that desorb from the subterranean formation during production of the gaseous hydrocarbons from the subterranean formation, and that therefore may be produced from the subterranean formation as gaseous hydrocarbons (or desorbed hydrocarbons). As an illustrative, non-exclusive example, the calculating at 220 may include calculating a difference between the total amount of adsorbed hydrocarbons, as determined at 210, and the portion of the total amount of adsorbed hydrocarbons that do not desorb, as determined at 215. As another illustrative, non-exclusive example, the calculating at 220 may include calculating the recoverable adsorbed gas in place using Equation (6).

Calculating the free gas in place within the subterranean formation at 225 may include the use of any suitable system, method, and/or algorithm to determine and/or calculate an amount, mass, and/or volume of gaseous hydrocarbons that are present within pores that may be present within the subterranean formation. As an illustrative, non-exclusive example, and when the pores do not contain liquid water, or contain an insignificant amount of liquid water, therein, the calculating at 225 may include calculating the free gas in place using Equation (7). As another illustrative, non-exclusive example, and when the pores do contain liquid water, or a significant amount of liquid water, therein, the calculating at 225 may include calculating the free gas in place using Equation (8).

Correcting the formation volume factor to generate the compensated formation volume factor at 230 may include correcting the formation volume factor in any suitable manner that adjusts the formation volume factor based, at least in part, on the fraction of the adsorbed hydrocarbons within the subterranean formation that transition to the gaseous hydrocarbons upon and/or during production of the gaseous hydrocarbons from the subterranean formation. As an illustrative, non-exclusive example, the correcting may include adjusting and/or decreasing the formation volume factor based, at least in part, on the total mass and/or total volume of adsorbed hydrocarbons that may be present within the subterranean formation and/or the pressure within the subterranean formation. Additionally or alternatively, the correcting also may include adjusting and/or decreasing the formation volume factor based, at least in part, upon Equation (3) and/or upon the determining at 210.

As another illustrative, non-exclusive example, the correcting may include adjusting and/or increasing the formation volume factor based, at least in part, on a portion of the total mass and/or volume of adsorbed hydrocarbons that does not desorb from the subterranean formation (or transition to desorbed and/or gaseous hydrocarbons) during production of the gaseous hydrocarbons from the subterranean formation. Additionally or alternatively, and as another illustrative, non-exclusive example, the correcting may include adjusting and/or increasing the formation volume factor based, at least in part, on the bottom hole pressure within the hydrocarbon well that extends within the subterranean formation. Additionally or alternatively, the correcting also may include adjusting and/or increasing the formation volume factor based, at least in part, upon Equation (4) and/or upon the determining at 215.

As yet another illustrative, non-exclusive example, the correcting also may include calculating the compensated formation volume factor based, at least in part, on the formation volume factor, as determined at 205, the recoverable adsorbed gas in place, as calculated at 220, and/or the free gas in place, as calculated at 225. Additionally or alternatively, the correcting may include calculating the compensated formation volume factor using Equation (2) and/or Equation (5).

Simulating the fluid flow within the subterranean formation at 235 may include simulating any suitable fluid flow within the subterranean formation based, at least in part, on the compensated formation volume factor. As illustrative, non-exclusive examples, the simulating may include simulating a flow of gaseous hydrocarbons, gaseous water, liquid hydrocarbons, and/or liquid water within the subterranean formation. Additionally or alternatively, the simulating at 235 also may include simulating production of the fluid from the subterranean formation.

Simulating the fluid flow within the subterranean formation further may include simulating the fluid flow through a porous medium, such as the subterranean formation and/or the rock matrix thereof. As an illustrative, non-exclusive example, this may include simulating the fluid flow using Darcy's law and/or simulating based, at least in part, upon a radius of a wellbore that is present within the subterranean formation, a permeability of a medium, such as the rock matrix, that comprises the subterranean formation, a viscosity of the fluid, a volume of the subterranean formation, and/or a pressure within the subterranean formation. It is within the scope of the present disclosure that the simulating may include simulating using any suitable simulator, simulation package, and/or mathematical algorithm, including numerical and/or analytical simulators, as discussed herein.

Determining the total production of gaseous hydrocarbons from the subterranean formation at 240 may include determining a total volume of gaseous hydrocarbons that may be produced from the subterranean formation over a production life thereof. The determining at 240 may be based, at least in part, on the compensated formation volume factor. As illustrative, non-exclusive examples, the determining at 240 may include determining the pressure within the subterranean formation, such as by measuring the pressure within an observation well that extends within the subterranean formation, and/or calculating the compensated formation volume factor, such as via the correcting at 230.

Constructing the gaseous hydrocarbon well that extends within the subterranean formation at 245 may include constructing any suitable gaseous hydrocarbon well, wherein the constructing is based, at least in part, on the compensated formation volume factor, as determined by the correcting at 230, and/or on the simulating at 235. As an illustrative, non-exclusive example, the simulating at 235 may include modeling production of the gaseous hydrocarbons from the subterranean formation, and the constructing may include sizing any suitable component of the gaseous hydrocarbon well based, at least in part, on the modeling. Illustrative, non-exclusive examples of components of the gaseous hydrocarbon well include any suitable casing, liner, pump, fluid conduit, valve, and/or perforation.

As another illustrative, non-exclusive example, the modeling may include estimating and/or predicting a magnitude of a fluid flow rate within the gaseous hydrocarbon well, and the constructing may include sizing one or more components of the gaseous hydrocarbon well based, at least in part, on the magnitude of the fluid flow rate. This may include increasing a size of the one or more components responsive to determining that the predicted magnitude of the fluid flow rate is greater than an upper threshold fluid flow rate and/or decreasing the size of the one or more components responsive to determining that the predicted magnitude of the fluid flow rate is less than a lower threshold fluid flow rate.

Producing the gaseous hydrocarbons from the subterranean formation at 250 may include producing the gaseous hydrocarbons from the subterranean formation based, at least in part, upon the compensated formation volume factor, as determined at 230, and/or on the simulating at 235. As illustrative, non-exclusive examples, the producing may include controlling a production rate of the gaseous hydrocarbons, such as to maintain the production rate within a desired, or target, production rate range and/or to maintain a bottom hole pressure within the gaseous hydrocarbon well within a desired, or target, bottom hole pressure range.

The controlling may include increasing the production rate if the production rate is less than a lower threshold production rate and/or if the bottom hole pressure is greater than an upper threshold bottom hole pressure. The controlling further may include decreasing the production rate if the production rate is greater than an upper threshold production rate and/or if the bottom hole pressure is less than a lower threshold bottom hole pressure. It is within the scope of the present disclosure that the production rate and/or the bottom hole pressure may be measured during production of the gaseous hydrocarbon from the subterranean formation. However, it is also within the scope of the present disclosure that the production rate and/or the bottom hole pressure may be estimated, predicted, and/or calculated based, at least in part, on the simulating at 235.

Additionally or alternatively, the simulating at 235 may include predicting a depletion pressure for the subterranean formation and the controlling may include controlling based, at least in part, on the predicted depletion pressure. This may include decreasing the production rate and/or ceasing the production responsive to determining that the pressure within the subterranean formation is approaching, less than, and/or equal to the predicted depletion pressure for the subterranean formation.

Adjusting the compensated formation volume factor at 255 may include adjusting, changing, and/or re-calculating the compensated formation volume factor to produce an adjusted compensated formation volume factor based, at least in part, on any suitable criteria. As illustrative, non-exclusive examples, the adjusting at 255 may include periodically adjusting the compensated formation volume factor, such as by adjusting at regular time intervals, and/or adjusting the compensated formation volume factor during production of the gaseous hydrocarbons from the subterranean formation, such as responsive to a change in the pressure of the subterranean formation. It is within the scope of the present disclosure that the adjusting at 255 may include measuring the pressure within the subterranean formation, and/or the bottom hole pressure, such as via the observation well and/or via the gaseous hydrocarbon well, and adjusting the compensated formation volume factor to produce the adjusted compensated formation volume factor based, at least in part, upon the measured pressure.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

It is within the scope of the present disclosure that an individual step of a method recited herein, may additionally or alternatively be referred to as a "step for" performing the recited action.

INDUSTRIAL APPLICABILITY

The systems and methods disclosed herein are applicable to the oil and gas industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of controlling production of gaseous hydrocarbons from a subterranean formation using a compensated formation volume factor, the method comprising:
   determining at least one of a surface liquid production volume and a temporally corresponding surface gas production volume, at surface pressure conditions;
   determining a formation volume factor for gaseous hydrocarbons within the subterranean formation using the determined at least one of the surface liquid production volume and the temporally corresponding surface gas production volume;
   correcting the determined formation volume factor to generate the compensated formation volume factor by adjusting the formation volume factor based on a fraction of adsorbed hydrocarbons within the subterranean formation that transitions to the gaseous hydrocarbons during production of the gaseous hydrocarbons from the subterranean formation;
   selecting at least one of a target producing bottom hole rate and a target producing bottom hole pressure using the compensated formation volume factor at subterranean pressure conditions, using the compensated formation volume factor; and
   adjusting a production choke to achieve the selected at least one of the target producing bottom hole rate and the target producing bottom hole pressure, based on a/the total volume of the adsorbed hydrocarbons, wherein the total volume of the adsorbed hydrocarbons is calculated from;

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

2. The method of claim 1, wherein the adjusting includes adjusting, and optionally decreasing, the formation volume factor based on at least one, and optionally all, of a total mass of the adsorbed hydrocarbons, a total volume of the adsorbed hydrocarbons, and a pressure within the subterranean formation.

3. The method of claim 2, wherein the method further includes determining a total amount of the adsorbed hydrocarbons, and optionally wherein the determining includes determining at least one of the total mass of the adsorbed hydrocarbons, the total volume of the adsorbed hydrocarbons, and the pressure within the subterranean formation.

4. The method of claim 1, wherein the adjusting includes adjusting, and optionally increasing, the formation volume factor based on at least one of:
   (i) a portion of a/the total mass of the adsorbed hydrocarbons that does not transition to the gaseous hydrocarbons during production of the gaseous hydrocarbons from the subterranean formation;
   (ii) a portion of a/the total volume of the adsorbed hydrocarbons that does not transition to the gaseous hydrocarbons during production of the gaseous hydrocarbons from the subterranean formation; and
   (iii) a bottom hole pressure of a hydrocarbon well that is configured to produce the gaseous hydrocarbons from the subterranean formation.

5. The method of claim 1, wherein the adjusting includes adjusting, and optionally increasing, the formation volume factor based on a portion of a/the total amount of the adsorbed hydrocarbons that does not desorb during production of the gaseous hydrocarbons from the subterranean formation.

6. The method of claim 5, wherein the method further includes determining the portion of the total amount of the adsorbed hydrocarbons that does not desorb during production of the gaseous hydrocarbons from the subterranean formation, and optionally wherein the determining includes determining at least one of:
  (i) a/the portion of a/the total mass of the adsorbed hydrocarbons that does not transition to the gaseous hydrocarbons during production of the gaseous hydrocarbons from the subterranean formation;
  (ii) a/the portion of a/the total volume of the adsorbed hydrocarbons that does not transition to the gaseous hydrocarbons during production of the gaseous hydrocarbons from the subterranean formation; and
  (iii) a/the bottom hole pressure of a hydrocarbon well that is configured to produce the gaseous hydrocarbons from the subterranean formation.

7. The method of claim 1, wherein the adjusting includes adjusting, and optionally increasing, the formation volume factor based on a portion of a/the total volume of the adsorbed hydrocarbons that does not transition to the gaseous hydrocarbons during production of the gaseous hydrocarbons from the subterranean formation, which is calculated from:

$$TV_{NT} = \rho_r Ah(1-\varphi)V_L\left(\frac{p_{BHP}}{p_{BHP}+P_L}\right)$$

where $\rho_r$ is a/the density of rock within the subterranean formation, A is a/the drainage area of the subterranean formation, h is a/the net pay thickness of the subterranean formation, $\varphi$ is a/the porosity of the subterranean formation, $V_L$ is a/the Langmuir volume for the adsorbed hydrocarbons, $P_L$ is a/the Langmuir pressure for the adsorbed hydrocarbons, and $p_{BHP}$ is a bottom hole pressure within a gaseous hydrocarbon well that is present within the subterranean formation.

8. The method of claim 1, wherein the gaseous hydrocarbons define a first source of gaseous hydrocarbons within the subterranean formation, wherein the adsorbed hydrocarbons define a second source of gaseous hydrocarbons within the subterranean formation, and further wherein the correcting includes calculating the compensated formation volume factor based, at least in part, on a sum of the first source and the second source, optionally wherein the calculating includes summing the first source and the second source in parallel, and further optionally wherein the calculating includes accounting for a portion of the second source that does not desorb from the subterranean formation.

9. The method of claim 1, wherein the correcting includes calculating the compensated formation volume factor using an equation:

$$B_g^c = \frac{1}{\frac{1}{B_g}+\frac{GIP^{ra}}{GIP}}$$

where $B_g$ is the formation volume factor, GIP is a free gas in place, and $GIP^{ra}$ is a recoverable adsorbed gas in place.

10. The method of claim 9, wherein the recoverable adsorbed gas in place is determined based, at least in part, on a Langmuir isotherm for adsorption of the gaseous hydrocarbons within the subterranean formation.

11. The method of claim 10, wherein the method includes calculating the recoverable adsorbed gas in place using the equation:

$$GIP^{ra} = \rho_r Ah(1-\varphi)V_L\left(\frac{P}{P+P_L} - \frac{p_{BHP}}{p_{BHP}+P_L}\right)$$

where $\rho_r$ is a/the density of rock within the subterranean formation, A is a/the drainage area of the subterranean formation, h is a/the net pay thickness of the subterranean formation, $\varphi$ is a/the porosity of the subterranean formation, $V_L$ is a/the Langmuir volume for the adsorbed hydrocarbons, $P_L$ is a/the Langmuir pressure for the adsorbed hydrocarbons, $p_{BHP}$ is a/the bottom hole pressure within a/the gaseous hydrocarbon well that is present within the subterranean formation, and P is a/the pressure within the subterranean formation.

12. The method of claim 11, wherein the method further includes determining at least one of the Langmuir volume and the Langmuir pressure.

13. The method of claim 12, wherein the determining includes compressing the gaseous hydrocarbons in the presence of a portion of a rock matrix from the subterranean formation and detecting a pressure that is associated with a given compression.

14. The method of claim 10, wherein the determining includes receiving the formation volume factor.

15. The method of claim 9, wherein the method includes calculating the free gas in place using the equation:

$$GIP = \frac{Ah\varphi}{B_g}$$

where A is a/the drainage area of the subterranean formation, h is a/the net pay thickness of the subterranean formation, and $\varphi$ is a/the porosity of the subterranean formation.

16. The method of claim 9, wherein the method includes calculating the free gas in place using the equation:

$$GIP = \frac{Ah\varphi(1-S_w)}{B_g}$$

where A is a/the drainage area of the subterranean formation, h is a/the net pay thickness of the subterranean formation, $\varphi$ is a/the porosity of the subterranean formation, and $S_w$ is a water saturation of pores within the subterranean formation.

17. The method of claim 1, wherein the determining includes calculating the formation volume factor, and optionally wherein the calculating the formation volume factor includes simulating the subterranean formation.

18. The method of claim 1, wherein the determining includes measuring the formation volume factor, and optionally wherein the measuring the formation volume factor includes at least one of producing a produced gas from the subterranean formation, compressing the produced gas, measuring a volume of the produced gas at a pressure and a temperature of the subterranean formation, and producing a pressure vs. volume curve for the produced gas at a given temperature.

19. A method of producing gaseous hydrocarbons from a subterranean formation, the method comprising:
receiving a compensated formation volume factor for gaseous hydrocarbons in a subterranean formation that includes the gaseous hydrocarbons and adsorbed hydrocarbons; and
simulating a fluid flow within the subterranean formation based, at least in part, on the compensated formation volume factor; and
controlling production from the subterranean formation based at least in part upon the compensated formation volume factor;
adjusting, and optionally decreasing, the formation volume factor based on a/the total volume of the adsorbed hydrocarbons, wherein the total volume of the adsorbed hydrocarbons is calculated from:

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

20. The method of claim 19, wherein the receiving includes calculating the compensated formation volume factor using a method comprising:
determining a formation volume factor for gaseous hydrocarbons within the subterranean formation; and
correcting the formation volume factor to generate the compensated formation volume factor by adjusting the formation volume factor based on a fraction of adsorbed hydrocarbons within the subterranean formation that transitions to the gaseous hydrocarbons during production of the gaseous hydrocarbons from the subterranean formation.

21. The method of claim 19, wherein the simulating a fluid flow includes at least one of simulating a flow of the gaseous hydrocarbons within the subterranean formation and simulating a production of the gaseous hydrocarbons from the subterranean formation.

22. The method of claim 19, wherein the simulating a fluid flow includes at least one of simulating a flow of water within the subterranean formation and simulating a production of water from the subterranean formation.

23. The method of claim 19, wherein the simulating a fluid flow includes simulating the fluid flow through a porous medium, optionally wherein the porous medium comprises the subterranean formation, and further optionally wherein the methods include simulating the fluid flow through the porous medium using Darcy's law.

24. The method of claim 23, wherein the simulating the fluid flow through the porous medium includes simulating based, at least in part, on at least one of a radius of a wellbore that is present within the subterranean formation, a permeability of the porous medium that comprises the subterranean formation, a viscosity of the gaseous hydrocarbons, a volume of the subterranean formation, and a pressure within the subterranean formation.

25. The method of claim 19, wherein the method further includes adjusting the compensated formation volume factor.

26. The method of claim 25, wherein the adjusting the compensated formation volume factor includes at least one of calculating an adjusted compensated formation volume factor, periodically adjusting the compensated formation volume factor, and adjusting the compensated formation volume factor while producing the gaseous hydrocarbons from the subterranean formation.

27. The method of claim 26, wherein the adjusting the compensated formation volume factor includes adjusting the compensated formation volume factor responsive to a change in a/the pressure within the subterranean formation, optionally wherein the method further includes measuring the pressure within the subterranean formation, optionally wherein the measuring includes measuring the pressure within at least one of an observation well that extends within the subterranean formation and a production well that extends within the subterranean formation, and further optionally wherein the observation well is separate from the production well.

28. A method of producing gaseous hydrocarbons from a subterranean formation, the method comprising:
modeling production of the gaseous hydrocarbons using a method comprising:
(i) receiving a compensated formation volume factor for gaseous hydrocarbons in a subterranean formation that includes the gaseous hydrocarbons and adsorbed hydrocarbons; and
(ii) simulating a fluid flow within the subterranean formation based, at least in part, on the compensated formation volume factor; and
producing the gaseous hydrocarbons from the subterranean formation, wherein the producing is based, at least in part, on the modeling;
adjusting, and optionally decreasing, the formation volume factor based on a/the total volume of the adsorbed hydrocarbons, wherein the total volume of the adsorbed hydrocarbons is calculated from:

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

29. The method of claim 28, wherein the method further includes controlling production of the gaseous hydrocarbons based, at least in part, on the modeling.

30. The method of claim 29, wherein the controlling includes at least one of controlling a production rate of the gaseous hydrocarbons and controlling a bottom hole pressure in a well that is configured to produce the gaseous hydrocarbons.

31. The method of claim 28, wherein the modeling includes predicting a depletion pressure for the subterranean formation, and further wherein the controlling includes ceasing the producing based, at least in part, on determining that a pressure within the subterranean formation is less than the depletion pressure.

32. The method of claim 28, wherein the method further includes desorbing a portion of the adsorbed hydrocarbons to produce gaseous hydrocarbons.

33. A method of constructing and operating a gaseous hydrocarbon well, the method comprising:
    modeling production of the gaseous hydrocarbons using a method comprising:
    (i) receiving a compensated formation volume factor for gaseous hydrocarbons in a subterranean formation that includes the gaseous hydrocarbons and adsorbed hydrocarbons; and
    (ii) simulating a fluid flow within the subterranean formation based, at least in part, on the compensated formation volume factor; and
    sizing a component of the gaseous hydrocarbon well based, at least in part, on the modeling; and
    controlling production of gaseous hydrocarbons from the gaseous hydrocarbon well using the compensated formation volume factor;
    adjusting, and optionally decreasing, the formation volume factor based on a/the total volume of the adsorbed hydrocarbons, wherein the total volume of the adsorbed hydrocarbons is calculated from:

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

34. The method of claim 33, wherein the component of the gaseous hydrocarbon well includes at least one of a casing, a liner, fluid conduit, a pump, a perforation, and a valve.

35. A method of determining a total volume of gaseous hydrocarbons that may be produced from a subterranean formation and operating a well for producing at least a portion of the gaseous hydrocarbons from the subterranean formation, the method comprising:
    determining a pressure within the subterranean formation;
    calculating a compensated formation volume factor from the determined pressure using the method including the steps of:
    (i) determining a formation volume factor for gaseous hydrocarbons within the subterranean formation; and
    (ii) correcting the formation volume factor to generate the compensated formation volume factor by adjusting the formation volume factor based on a fraction of adsorbed hydrocarbons within the subterranean formation that transitions to the gaseous hydrocarbons during production of the gaseous hydrocarbons from the subterranean formation; and
    controlling production of gaseous hydrocarbons from the subterranean formation using the compensated formation volume factor;
    adjusting, and optionally decreasing, the formation volume factor based on a/the total volume of the adsorbed hydrocarbons, wherein the total volume of the adsorbed hydrocarbons is calculated from:

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

36. The method of claim 35, wherein the determining includes measuring the pressure within an observation well that extends within the subterranean formation.

37. The method of claim 35, wherein the gaseous hydrocarbons are in a gaseous state within the subterranean formation.

38. The method of claim 35, wherein the adsorbed hydrocarbons are adsorbed on a surface within the subterranean formation.

39. The method of claim 38, wherein the adsorbed hydrocarbons transition to gaseous hydrocarbons by desorbing from the surface, and optionally wherein the method includes desorbing the adsorbed hydrocarbons from the surface to produce the gaseous hydrocarbons.

40. The method of claim 39, wherein the surface includes at least one of a subterranean structure and a rock matrix.

41. The method of claim 35, wherein the subterranean formation includes at least one of a shale gas formation, a tight gas formation, and a coal gas formation.

42. A gaseous hydrocarbon production assembly comprising:
    a hydrocarbon well; and
    a control system programmed to at least one of;
    (i) model the production of the gaseous hydrocarbons using a method comprising; and
    (ii) control the production of the gaseous hydrocarbons, using a method comprising;
        (a) receiving a compensated formation volume factor for gaseous hydrocarbons in a subterranean formation that includes the gaseous hydrocarbons and adsorbed hydrocarbons; and
        (b) simulating a fluid flow within the subterranean formation based, at least in part, on the compensated formation volume factor;
    adjusting, and optionally decreasing, the formation volume factor based on a/the total volume of the adsorbed hydrocarbons, wherein the total volume of the adsorbed hydrocarbons is calculated from:

$$TV = \rho_r Ah(1-\varphi)V_L\left(\frac{P}{P+P_L}\right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

43. The gaseous hydrocarbon production assembly of claim 42, wherein the control system is further programmed to control a production rate of the gaseous hydrocarbons based, at least in part, on the model.

44. The gaseous hydrocarbon production assembly of claim 42, wherein the control system is further programmed to transition the gaseous hydrocarbon production assembly from a producing state to an idle state based, at least in part, on the model.

45. A non-transitory computer-readable storage media having processor instructions that are executable to cause a processor to perform a computer executable method for controlling the production of gaseous hydrocarbons from a subterranean well, comprising:
   determining a formation volume factor for gaseous hydrocarbons within the subterranean formation;
   correcting the formation volume factor to generate the compensated formation volume factor by adjusting the formation volume factor based on a fraction of adsorbed hydrocarbons within the subterranean formation that transitions to the gaseous hydrocarbons during production of the gaseous hydrocarbons from the subterranean formation;
   sending well operational control signals from the processor to a system for controlling production of gaseous hydrocarbons from the well using the compensated formation volume factor; and
   adjusting the formation volume factor, and optionally decreasing, the formation volume factor based on a/the total volume of the adsorbed hydrocarbons, wherein the total volume of the adsorbed hydrocarbons is calculated from:

$$TV = \rho_r A h (1 - \varphi) V_L \left( \frac{P}{P + P_L} \right)$$

where $\rho_r$ is a density of rock within the subterranean formation, A is a drainage area of the subterranean formation, h is a net pay thickness of the subterranean formation, $\varphi$ is a porosity of the subterranean formation, $V_L$ is a Langmuir volume for the adsorbed hydrocarbons, $P_L$ is a Langmuir pressure for the adsorbed hydrocarbons, and P is a pressure within the subterranean formation.

46. The storage media of claim 45, comprising executable instructions that when executed implements the computer-executable method.

47. The storage media of claim 45, used with a processor to model a characteristic of a subterranean formation, the processor using the computer-executable method.

48. The storage media of claim 47, wherein the modeled characteristic relates to a fluid flow within the subterranean formation.

* * * * *